(12) United States Patent
Patra

(10) Patent No.: US 10,514,611 B2
(45) Date of Patent: Dec. 24, 2019

(54) PROJECTION EXPOSURE METHOD AND PROJECTION EXPOSURE APPARATUS FOR MICROLITHOGRAPHY

(71) Applicant: Carl Zeiss SMT GmbH, Oberkochen (DE)

(72) Inventor: Michael Patra, Oberkochen (DE)

(73) Assignee: Carl Zeiss SMT GmbH, Oberkochen (DE)

(*) Notice: Subject to any disclaimer, the term of this patent is extended or adjusted under 35 U.S.C. 154(b) by 0 days.

(21) Appl. No.: 16/296,662

(22) Filed: Mar. 8, 2019

(65) Prior Publication Data

US 2019/0204756 A1   Jul. 4, 2019

Related U.S. Application Data

(63) Continuation of application No. PCT/EP2017/071303, filed on Aug. 24, 2017.

(30) Foreign Application Priority Data

Sep. 20, 2016   (DE) .................. 10 2016 217 929

(51) Int. Cl.
   *G03F 7/20* (2006.01)
   *G03F 7/095* (2006.01)
   *G03F 7/00* (2006.01)

(52) U.S. Cl.
   CPC ........ *G03F 7/70575* (2013.01); *G03F 7/0037* (2013.01); *G03F 7/095* (2013.01);
   (Continued)

(58) Field of Classification Search
   CPC ...... G03F 7/0037; G03F 7/095; G03F 7/7005; G03F 7/70333; G03F 7/70466; G03F 7/70575; G03F 7/70808
   (Continued)

(56) References Cited

U.S. PATENT DOCUMENTS 4,937,619 A   6/1990   Fukuda et al.
5,303,002 A   4/1994   Yan
(Continued)

FOREIGN PATENT DOCUMENTS

CN   105334699 A   2/2016

OTHER PUBLICATIONS

B. Todd et al., "Thick Photoresist Imaging Using A Three Wavelength Exposure Stepper", SPIE MEMS 1999 #3874-40, pp. 1-15.
(Continued)

*Primary Examiner* — Colin W Kreutzer
(74) *Attorney, Agent, or Firm* — Fish & Richardson P.C.

(57) ABSTRACT

The disclosure provides a projection exposure method for exposing a substrate arranged in the region of an image plane of a projection lens with at least one image of a pattern of a mask arranged in the region of an object plane of the projection lens. A substrate is coated with a radiation-sensitive multilayer system including a first photoresist layer composed of a first photoresist material and, between the first photoresist layer and the substrate and a separately applied second photoresist layer composed of a second photoresist material. The first photoresist material has a relatively high first sensitivity in a first wavelength range and a second sensitivity, which is lower relative to the first sensitivity, in a second wavelength range separate from the first wavelength range. The second photoresist material has an exposure-suitable second sensitivity in the second wavelength range.

19 Claims, 4 Drawing Sheets

(52) U.S. Cl.
CPC ...... *G03F 7/70333* (2013.01); *G03F 7/70458* (2013.01); *G03F 7/70466* (2013.01); *G03F 7/70808* (2013.01)

(58) Field of Classification Search
USPC .............................................. 355/37, 55, 67
See application file for complete search history.

(56) References Cited

U.S. PATENT DOCUMENTS

| | | |
|---|---|---|
| 7,760,452 B2 | 7/2010 | Mizuno |
| 8,445,447 B2 | 5/2013 | Chen |
| 2004/0029034 A1 | 2/2004 | Hishiro |
| 2007/0254490 A1 | 11/2007 | Jain |
| 2010/0272967 A1 | 10/2010 | Chen et al. |
| 2012/0049262 A1 | 3/2012 | Huang et al. |

OTHER PUBLICATIONS

J. Paul et al., "Evaluation of an advanced dual hard mask stack for high resolution pattern transfer", Proc. of SPIE vol. 8685 86850V-1 to 86850V-11.
Translation of International Search Report for corresponding PCT Appl No. PCT/EP2017/071303, dated Jan. 5, 2018.
German Office Action, with translation thereof, for corresponding DE Appl No. 10 2016 217 929.2, dated Jun. 1, 2017.

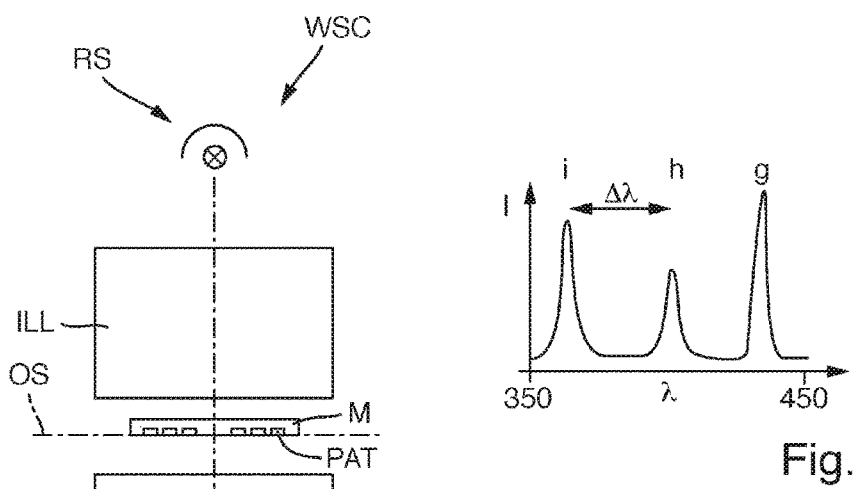
Fig. 2
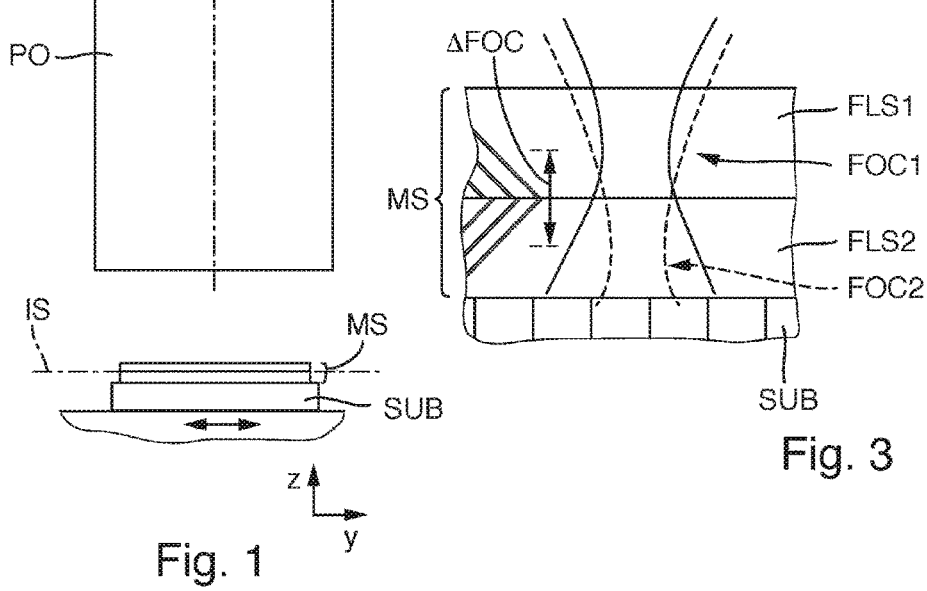
Fig. 1
Fig. 3

PROJECTION EXPOSURE METHOD AND PROJECTION EXPOSURE APPARATUS FOR MICROLITHOGRAPHY

CROSS-REFERENCE TO RELATED APPLICATIONS

The present application is a continuation of, and claims benefit under 35 USC 120 to, international application PCT/EP2017/071303, filed Aug. 24, 2017, which claims benefit under 35 USC 119 of German Application No. 10 2016 217 929.2, filed Sep. 20, 2016. The entire disclosure of these applications are incorporated by reference herein.

FIELD

The disclosure relates to a projection exposure method for exposing a substrate arranged in the region of an image plane of a projection lens with at least one image of a pattern of a mask arranged in the region of an object plane of the projection lens, and to a projection exposure apparatus suitable for carrying out the method.

BACKGROUND

Microlithographic projection exposure methods are predominantly used nowadays for producing semiconductor components and other finely structured components, such as, for example, structured components for microsystems engineering. Highly integrated semiconductor components typically include a plurality of layers, of which only some layers are structured very finely, e.g. on the scale of a few dozen nanometers, while other layers have significantly coarser structures. The former layers realize in particular the actual main function of the semiconductor component, such as e.g. calculations and storage of data, while the latter layers serve e.g. for addressing and power supply. Structures having relatively coarse typical dimensions are also found in the field of microsystems engineering, such as e.g. in microelectromechanical systems (MEMS) or in microoptoelectromechanical systems (MOEMS). Semiconductor components are typically produced from a substrate of a semiconductor, while other substrate materials, in particular metals and vitreous substances, are also used in microsystems engineering.

Microlithographic projection exposure involves the use of masks (reticles) bearing the pattern of a structure to be imaged, e.g. a line pattern of a layer of a semiconductor component. A mask is positioned in a projection exposure apparatus between an illumination system and a projection lens in the region of the object plane of the projection lens and is illuminated with an illumination radiation provided by the illumination system. The radiation altered by the mask and the pattern passes as projection radiation through the projection lens, which images the pattern of the mask onto the substrate to be exposed. The substrate can be e.g. a semiconductor wafer. The substrate to be exposed bears a radiation-sensitive (i.e. photosensitive) layer composed of photoresist material on its side to be structured. The layer is also referred to as a resist layer.

In order that an image of the pattern that is as faithful to the original as possible is transferred to the substrate during the exposure process, the radiation-sensitive layer on the substrate surface should lie in the image-side focus region of the projection lens during the exposure time interval. In particular, the layer arranged on the substrate surface should lie in the region of the depth of focus (DOF) of the projection lens.

According to one common definition, the depth of focus specifies the distance relative to the plane of best focus for which the intensity of a point image is at least 80% of the intensity in the plane of best focus. This is equivalent to the condition that the diameter of the point image maximally doubles. The depth of focus amounts to half of the Rayleigh unit RU, which is defined as $RU=\lambda/NA^2$, wherein $\lambda$ is the operating wavelength of the projection exposure apparatus and NA is the image-side numerical aperture of the projection lens; the region in which the depth of focus condition is met accordingly has a total thickness equal to the Rayleigh unit RU. In general, the depth of focus becomes smaller, the higher the resolution capability of the projection lens.

Further miniaturization of the feature sizes on computer chips is becoming more and more difficult technically and physically. The associated costs are making further miniaturization of the feature sizes less and less attractive in some cases. As an alternative to better utilization of the wafer area, it is possible instead to utilize the third dimension by producing structures not just on or at the surface of the wafer but into the wafer in the depth direction.

The third dimension has e.g. already been used for the production of DRAM structures with the involved capacitors being etched into the depth (see e.g. US 2012/0049262 A1). Another trend is the three-dimensional stacking of flash memory structures (see e.g. U.S. Pat. No. 8,445,447 B2). Since the silicon layers grown are amorphous instead of crystalline, only relatively coarse structures can be produced with a functional capability for electronic reasons, which is why it is generally not necessary to use relatively short wavelengths such as 193 nm or even 13 nm for lithography processes of this type.

In order to be able to produce deep structures, holes having a large aspect ratio between depth and width are etched into the substrate. This can be done for example via a dry etching process, such as e.g. via ion etching. Etching methods of this type attack not only the substrate but also the developed and cured photoresist. The radiation-sensitive layer should therefore have a minimum thickness which is not too small.

For the exposure of relatively thick photoresist layers, in the field of 193 nm immersion lithography it is known to use so-called "Focus Drilling". The ArF laser sources used in that case are so narrowband that it is not necessary for the corresponding projection lenses to be completely chromatically corrected. The wavelength dependence of the projection lens primarily consists in a (color-dependent) focus position dependent on the wavelength of the radiation used. By adjusting the line narrowing module (LNM) of an ArF laser in a targeted manner, it is possible for the bandwidth of the laser to be artificially increased. Different constituents of the spectrum which is continuous within the used bandwidth then simultaneously produce different focus positions. An effective increase in the depth of the region transilluminated within the photoresist layer thus occurs. However, this increase in the effectively usable depth of focus leads to blurring and thus to a reduction of contrast, which leads to coarser and/or less accurately definable structures on the finished structured substrate.

The article: "Thick Photoresist Imaging Using A Three Wavelength Exposure Stepper" by B. Todd, W. W. Flack and S. White in: SPIE MEMS 1999 #3874-40, pages 1-15 describes the suitability of three ultrathick photoresists (layer thicknesses of 50 μm or 100 μm) for application in microstructuring with large aspect ratios using a wafer stepper having a mercury vapor lamp as radiation source. A catadioptric projection lens of the 1× Wynne-Dyson type having an image-side numerical aperture NA=0.16 is used for the imaging. Projection lenses of the Wynne-Dyson type allow a broadband exposure without introducing chromatic aberrations. For the exposure, the g-, h- and i-lines of mercury are used simultaneously in a wide spectral range of 350 nm to 450 nm (ghi-stepper). The results are compared with results of other experiments with a gh-line stepper and an i-line stepper of higher NA.

Another technology for producing holes extending deeply into a substrate with a high aspect ratio is multiple patterning using so-called hard masks. Examples are found in the article: "Evaluation of an advanced dual hard mask stack for high resolution pattern transfer" by J. Paul, M. Rudolph, S. Riedel, X. Thrun, S. Wege and C. Hohle in: Proc. of SPIE vol. 8685 86850V-1 to 86850V-11. The process is relatively complex and expensive. Moreover, each additional process step can lead to additional edge positioning errors of the structures produced on the substrate.

SUMMARY

The disclosure seeks to provide a projection exposure method which allows the exposure of a relatively thick radiation-sensitive layer on a substrate to be exposed such that an exposed volume having sharp contours positioned correctly is producible over the entire thickness of the layer. The disclosure further seeks to provide a projection exposure apparatus suitable for carrying out the method.

In an aspect, the disclosure provides a projection exposure method for exposing a substrate arranged in the region of an image plane of a projection lens with at least one image of a pattern of a mask arranged in the region of an object plane of the projection lens. The method includes the following steps: coating the substrate with a radiation-sensitive multilayer system including a first photoresist layer composed of a first photoresist material and, between the first photoresist layer and the substrate, a separately applied second photoresist layer composed of a second photoresist material. The first photoresist material has a relatively high first sensitivity in a first wavelength range and a second sensitivity, which is lower relative to the first sensitivity, in a second wavelength range separate from the first wavelength range. The second photoresist material has an exposure-suitable second sensitivity in the second wavelength range. The method also includes exposing the substrate coated with the radiation-sensitive multilayer system with the image of the pattern using radiation of a radiation source having an operating wavelength range which includes the first wavelength range and the second wavelength range. A projection lens is used which is corrected for the first wavelength range and the second wavelength range in such a way that a first focus region associated with the first wavelength range is offset relative to a second focus region associated with the second wavelength range by a focal distance. The first focus region lies within the first photoresist layer and the second focus region lies within the second photoresist layer.

In an aspect, the disclosure provides a projection exposure apparatus for exposing a substrate arranged in the region of an image plane of a projection lens with at least one image of a pattern of a mask arranged in the region of an object plane of the projection lens. The projection exposure apparatus includes: a primary radiation source for emitting radiation in an operating wavelength range including a first wavelength range and a second wavelength range separate from the first wavelength range; an illumination system for receiving the radiation and for generating an illumination radiation directed onto the mask; and a projection lens for generating an image of the pattern in the region of the image surface of the projection lens. The projection lens is corrected at least for the first wavelength range and the second wavelength range in such a way that with each wavelength in the first and second wavelength ranges a sharp diffraction-limited imaging of the pattern onto the substrate is possible with an identical imaging scale. A first focus region associated with the first wavelength range is offset relative to a second focus region associated with the second wavelength range by a focal distance.

In an aspect, the disclosure provides a method for producing a coated substrate for use in a projection exposure method using radiation of a radiation source having an operating wavelength range comprising a first wavelength range and a second wavelength range separate from the first wavelength range. The method includes coating the substrate with a radiation-sensitive multilayer system comprising a first photoresist layer composed of a first photoresist material and, between the first photoresist layer and the substrate, a separately applied second photoresist layer composed of a second photoresist material. The first photoresist material has a relatively high first sensitivity in a first wavelength range and a second sensitivity, which is lower relative to the first sensitivity, in a second wavelength range separate from the first wavelength range. The second photoresist material has a second sensitivity in the second wavelength range.

Advantageous developments are specified in the disclosure. The wording of all the claims is incorporated by reference in the content of the description.

In the projection exposure method, the substrate is coated with a radiation-sensitive or photosensitive multilayer system. The multilayer system includes a first photoresist layer and a second photoresist layer, which is arranged between the first photoresist layer and the substrate. The first photoresist layer is thus situated nearer to the radiation entrance side or further away from the substrate than the second photoresist layer.

The first photoresist layer consists of a first photoresist material, while the second photoresist layer consists of a second photoresist material. The photoresist layers are applied separately, such that different photoresist materials can be used for the first and second photoresist layer. As a result, there are many degrees of freedom for the configuration of the layer construction of the multilayer system.

In many embodiments, the first and second photoresist materials are different. The differences concern especially the spectral sensitivity characteristic of the photoresist materials or the wavelength-dependent absorption behavior thereof. There are also embodiments in which the same photoresist material can be used for the first and second photoresist layers.

In the context of this application, the term "sensitivity" denotes the probability of an incident photon of a given wavelength leading to a desired photochemical reaction in the photoresist layer. A photoresist layer is sensitive to a specific wavelength range in this sense if the radiation from the wavelength range is absorbed in the photoresist material in such a way that this triggers a photochemical reaction that alters properties of the exposed volume of the photoresist material, in particular the solubility of the photoresist material, relative to the non-exposed volume such that exposed sections and unexposed sections behave differently in subsequent process steps.

The first photoresist material, which is arranged further away from the substrate, has a relatively high first sensitivity in a first wavelength range and a second sensitivity, which is lower relative to the first sensitivity, in a second wavelength range separate from the first wavelength range. The first photoresist material is intended to have an exposure-suitable first sensitivity (i.e. suitable for the exposure in the sense of the preceding paragraph) in the first wavelength range.

The second photoresist material is intended to have an exposure-suitable second sensitivity (i.e. suitable for the exposure) in the second wavelength range. An "exposure-suitable" second sensitivity is present in particular if at least 10% of the photons in the second wavelength range are absorbed in the second photoresist layer and can trigger a photochemical reaction in this way.

The substrate coated with the radiation-sensitive multilayer system is exposed in an effective image field of the projection lens with the image of the pattern arranged in the object plane. The radiation of a radiation source having an operating wavelength range including the first wavelength range and the second wavelength range is used for the exposure.

For wavelengths which lie between these two wavelength ranges, it should hold true that the product of radiation intensity and wavelength-dependent sensitivity of the first photoresist material has significantly smaller values there than in the first wavelength range. Furthermore, it should hold true that the product of radiation intensity and wavelength-dependent sensitivity of the second photoresist material has significantly smaller values there than in the second wavelength range. For light sources typically used, the variation of the radiation intensity with the wavelength is greater than the variation of the sensitivity with the wavelength for typical photoresist materials. Accordingly, the above condition is usually readily achievable if the radiation intensity for wavelengths in the range between the first and second wavelength ranges is significantly lower than in the first and second wavelength ranges. This condition then has the effect, in particular, that there is a finite spectral separation $\Delta\lambda$ between the centroid wavelengths of the first wavelength range and the second wavelength range.

In the method, a projection lens is used which is corrected for the first wavelength range and the second wavelength range in such a way that a first focus region associated with the first wavelength range is offset relative to a second focus region associated with a second wavelength range by a focal distance. The positions of the first and second focus regions or the focal distance are coordinated with the layer construction of the radiation-sensitive multilayer system such that the first focus region lies within the first photoresist layer and the second focus region lies within the second photoresist layer.

What can be achieved by coating the substrate with a photosensitive multilayer system of the type described is that the radiation-sensitive coating on the substrate is not equally sensitive to all wavelengths of the used radiation at all points, but rather is sensitive to an specific wavelength primarily where the focus of the corresponding wavelength lies. In this case, the first photoresist material, which lies nearer to the radiation entrance side, should react primarily to radiation from the first wavelength range, such that the number (relevant to the triggering of the photochemical reaction) of the absorbed photons from the second wavelength range, owing to the relatively lower second sensitivity, is small in relation to the number of the absorbed photons of the first wavelength. The second photoresist material, which lies nearer to the substrate, or the second photoresist layer should react primarily to the radiation from the second wavelength range which is allowed to pass through or is transmitted in a relatively large proportion to the second photoresist layer from the overlying first photoresist layer on account of the lower absorption there for the second wavelength.

Under these conditions, both in the first focus region within the first photoresist layer and in the second focus region within the second photoresist layer, a sharply defined exposure zone can be produced, such that within the multilayer system an increase in the depth of focus arises without attendant additional burring of the transition regions between exposed zones and unexposed zones.

Consequently, microlithographic projection exposure methods and projection exposure apparatuses become possible which allow thicker photoresist layers to be exposed without fading or some other loss of contrast in the aerial image occurring here.

The photoresists can be, in particular, polymer-based or epoxy resin-based photoresists. A photoresist can be designed as a positive resist or a negative resist. In the case of negative resists, the solubility decreases as a result of exposure; in the case of positive resists, the solubility increases as a result of exposure.

It should preferably be taken into consideration that an absorption of significantly more than 35% of the photons in the first wavelength range in the first photoresist layer can be disadvantageous since, within the layer, the intensity decreases exponentially on account of the absorption and a disadvantageous depth dependence of the dose can occur in the case of excessively high absorption. It is currently considered to be advantageous if for producing the first photoresist layer a first photoresist material is used which is selected such that between 10% and 60%, in particular between 20% and 40%, of the photons in the first wavelength range are absorbed within the first photoresist layer. If the lower limit is significantly undershot, a sufficiently intense reaction for altering the physico-chemical behavior of the exposed resist is not produced or the intensity of the light source would have to be increased in order to arrive at a sufficient exposure. If the optical absorption lies significantly above the upper limit, then a significantly noticeable depth dependence of the exposure within the first photoresist layer can occur, wherein the effective exposure would be significantly higher in the vicinity of the radiation entrance side than at a greater distance from the radiation entrance side. It is therefore considered to be advantageous if a relatively large proportion of the radiation from the first wavelength range is not absorbed in the first photoresist layer, but rather is transmitted through the latter.

Preferably, analogous conditions should be present in the case of the second photoresist layer with regard to radiation in the second wavelength range in order to avoid the depth dependence of the dose. For producing the second photoresist layer, a second photoresist material can thus be used which is selected such that between 10% and 60%, in particular between 20% and 40%, of the photons in the second wavelength range are absorbed within the second photoresist layer.

The photoresist materials can be selected according to specific criteria for the sensitivity characteristics with regard to the wavelength ranges used during the exposure.

In particular, it can be the case that the number of the photons in the first wavelength range that are absorbed in the first photoresist layer is at least 50%, in particular at least 100%, greater than the number of the photons in the second wavelength range that are absorbed in the first photoresist layer, and/or that the number of the photons in the second wavelength range that are absorbed in the second photoresist layer is at least 50%, in particular at least 100%, greater than the number of the photons in the first wavelength range that are absorbed in the second photoresist layer.

Preferably, the selection should be made such that fewer than 30% of the photons in the second wavelength range are absorbed within the first photoresist layer.

During the coating process, the first photoresist layer can be applied directly to the second photoresist layer, such that the radiation allowed to pass (transmitted) through the first photoresist layer enters the second photoresist layer directly and completely. It is also possible to provide an intervening intermediate layer. In one method variant, a color filter layer composed of a material having a greater transmission in the second wavelength range than in the first wavelength range is produced between the first photoresist layer and the second photoresist layer during the process of coating the substrate. The material of the color filter layer can be a photoresist material in which the absorption of photons triggers a photochemical reaction. However, this is not mandatory and is often not actually provided. It is sufficient if the absorbed photons are lost in the sense that they do not pass to the second photoresist layer nearer the substrate.

The color-selective intermediate layer (color filter layer) thus transmits more radiation in the second wavelength range in the direction of the second photoresist layer, while a larger proportion of radiation in the first wavelength range is absorbed. One advantage of this variant is that the second photoresist layer nearer the substrate can then be selected principally with regard to the absorptivity for radiation in the second wavelength range, while the behavior vis-à-vis radiation in the first wavelength range can be largely arbitrary. Since fewer desired attributes are made of the second photoresist material in this respect, more photoresist materials can be used for forming the second photoresist layer than in the case of variants without a third photoresist layer.

In particular, with the use of an interposed color filter layer it is also possible to use the same photoresist material for the first photoresist layer and the second photoresist layer, as a result of which possibly a less complex coating process is made possible.

The layer thicknesses of the first photoresist layer and/or of the second photoresist layer can be chosen freely within certain limits. In order to obtain particularly good process results it appears to be advantageous for the layer thicknesses of the first photoresist layer and/or of the second photoresist layer to be adapted to the depth of focus characteristic of the projection lens at the wavelengths used. As is known, the depth of focus is proportional to the Rayleigh unit RU, which is defined as $RU=\lambda/NA^2$ wherein $\lambda$ is the wavelength under consideration and NA is the image-side numerical aperture of the projection lens. The layer thickness of the first photoresist layer should preferably be less than the Rayleigh unit for the centroid wavelength $\lambda_1$ of the first wavelength range. In particular, it is considered to be advantageous if a layer thickness of the first photoresist layer lies in the range of $RU_1$ to $RU_1/4$, wherein $RU_1=\lambda_1/NA^2$, wherein $\lambda_1$ is a centroid wavelength of the first wavelength range. Alternatively or additionally, a corresponding condition can hold true for the layer thickness of the second photoresist layer as a function of the centroid wavelength $\lambda_2$ of the second wavelength range. If the layer thickness is smaller than the specified interval, then the depth of focus offered by the projection exposure apparatus is not fully utilized, that is to say that the photoresist layer is thinner than it could be and, therefore, in the etching process step succeeding the exposure, can protect underlying substrate regions for a shorter period of time and/or less well than would actually be possible. If the layer thickness is larger than the interval, then this results in a worsening of the image contrast in at least partial regions of the layer.

Alternatively or additionally, an optimization is possible taking account of the respective centroid wavelengths $\lambda$ of the wavelength ranges. The layer thicknesses can be at least of the same magnitude as the respective centroid wavelengths. The layer thicknesses can lie e.g. in the range of between 100% and 400% of the respective centroid wavelength. For projection exposure apparatuses having an image-side aperture that is significantly higher than the values of up to 0.6 that are customary nowadays in the wavelength range of between 350 nm and 450 nm, the layer thicknesses can also assume thinner values.

With the use of many suitable photoresists, the layer thickness of the first photoresist layer and/or of the second photoresist layer can lie in the range of approximately 50 nm to approximately 1500 nm, in particular in the range of 100 nm to 1000 nm.

Exposures having particularly sharp edges over larger depths furthermore result if the projection lens is designed in such a way that the focal distance lies in the range of $RU_M$ to $RU_M/4$, wherein $RU_M=\lambda_M/NA^2$, wherein $\lambda_M$ is an operating wavelength averaged from the first and second wavelength ranges and NA is the image-side numerical aperture of the projection lens. If these conditions are met, the focus regions lying in an axially offset fashion are generally able to be positioned well in the interior of the respectively associated photoresist layers at a distance from the layer interfaces.

As already mentioned, there should be a finite spectral separation $\Delta\lambda$ between the centroid wavelengths of the first and second wavelength ranges, which spectral separation $\Delta\lambda$ can be for example at least 10 nm. As a result, the chemico-physical processes in the different layers of the multilayer system can be controlled in a targeted manner and influenced independently of one another. Larger spectral separations $\Delta\lambda$, for example in the range of between 15 nm and 50 nm, can be advantageous since, as a result, spectrally separate regions having the desired different sensitivity properties can be used well in the spectral absorption characteristics of the photoresist materials fundamentally available.

The focal distance of the projection exposure apparatus for the different wavelength ranges and the layer thicknesses of the individual photoresist layers are advantageously adapted to one another. The distance between the focus positions for the first wavelength range and the second wavelength range differs preferably by a maximum of 50%, in particular by a maximum of 20% or 10%, from half the sum of the layer thicknesses of the photoresist layers. The focal distance (distance between the focus positions) can lie for example in the range of between the typical wavelength and ten times the typical wavelength, wherein the typical wavelength can be given for example by a wavelength averaged over all the wavelength ranges.

Particularly in applications seeking to produce relatively coarse structures, lasers are not required as radiation source. Rather, it can be the case that a mercury vapor lamp is used as radiation source, wherein the first wavelength range contains exactly one of the mercury lines having a centroid wavelength at approximately 365 nm (i-line), approximately 405 nm (h-line), and approximately 436 nm (g-line) and the second wavelength range contains exactly one different mercury line from among the mercury lines. Without further measures, instead of a continuous wide spectrum, the emission spectrum of a mercury vapor lamp provides discrete centroid wavelengths which are distinctly separated spectrally from one another.

In preferred exemplary embodiments, exactly two different wavelength ranges are used for the exposure (two-wavelength exposure). This affords the advantage, inter alia, of a relatively simple layer construction and correspondingly simple coating processes. However, the disclosure can be extended to a larger number of operating wavelength ranges and photoresist layers, e.g. to three, four, five or more wavelength ranges and, adapted thereto, a number of photoresist layers of different photoresist materials. An advantageous situation can be present if the number of operating wavelength ranges is equal to the number of strong emission lines of the primary radiation source, such that the use of three operating wavelength ranges can be advantageous, e.g. when a mercury vapor lamp is used. The arrangement can be such that the n-th photoresist layer, wherein small values of n lie further away from the substrate, in the n-th operating wavelength range has a sensitivity that is sufficient for the lithography process, while the first to (n-1)-th photoresist layers are substantially only sensitive to the first to (n-1)-th operating wavelength ranges.

The substrates—described for the first time in this application—with a radiation-sensitive multilayer system having specific properties enable the user to use the advantages of the claimed projection exposure method. The disclosure also relates to a method for producing a substrate with a radiation-sensitive multilayer system for use in a projection exposure method using radiation of a radiation source having an operating wavelength range including a first wavelength range and a second wavelength range separate from the first wavelength range. Furthermore, the disclosure relates to a substrate obtainable or obtained or produced by the method and coated with a radiation-sensitive multilayer system having specific properties.

The disclosure also relates to a projection exposure apparatus designed with regard to its radiation source and the projection lens in such a way that the projection exposure method described can be carried out therewith.

BRIEF DESCRIPTION OF THE DRAWINGS

Further advantages and aspects of the disclosure are evident from the claims and from the following description of preferred exemplary embodiments of the disclosure, which are explained below with reference to the figures, in which:

FIG. 1 shows components of a microlithographic projection exposure apparatus during the exposure of a substrate coated with a photosensitive multilayer system;

FIG. 2 schematically shows a typical emission spectrum of a mercury vapor lamp;

FIG. 3 shows a schematic detail of an excerpt from a two-layered multilayer system which is exposed with radiation from two separate wavelength ranges in focus regions lying offset with respect to one another;

DETAILED DESCRIPTION OF EXEMPLARY EMBODIMENTS

Figure 4:
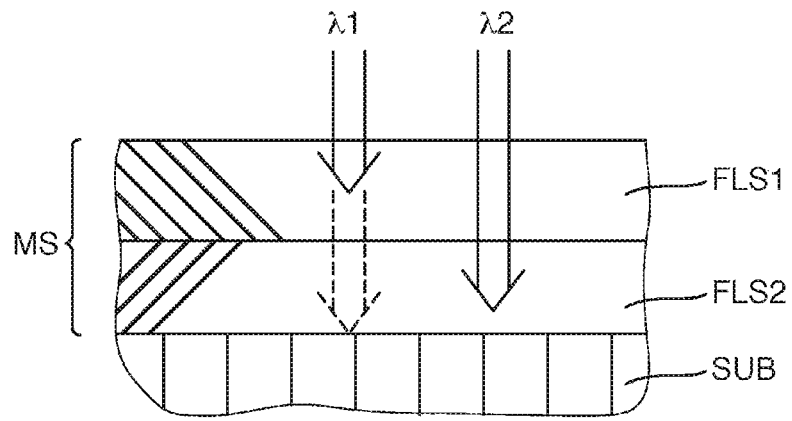
FIG. 4 schematically shows a layer construction of a photosensitive multilayer system having two photoresist layers lying one directly on top of the other.

Schematic FIG. 1 shows components of a microlithographic projection exposure apparatus WSC for exposing a substrate arranged in the region of an image plane IS of a projection lens PO with at least one image of a pattern PAT of a mask M arranged in the region of an object plane OS of the projection lens PO.

The projection exposure apparatus is operated with the radiation of a radiation source RS. An illumination system ILL serves for receiving the radiation of the radiation source and for shaping illumination radiation which is incident on the pattern of the mask M within an illumination field. The projection lens PO serves for imaging the structure of the pattern onto the light-sensitive substrate. The substrate can be e.g. a semiconductor wafer. The substrate to be exposed bears a radiation-sensitive layer MS composed of photoresist material (resist layer) on its side to be structured facing the projection lens.

The projection exposure apparatus is of the scanner type. A device for holding and manipulating the mask M (reticle), the device not being illustrated and also being referred to as "reticle stage", is designed such that the pattern PAT lies in the object plane OS of the projection lens, the object plane also being referred to as reticle plane. The mask is movable in this plane during scanner operation in a scanning direction (y-direction) perpendicularly to the reference axis AX of the projection lens with the aid of a scanner drive. The substrate to be exposed is carried with the aid of a device (not illustrated) which is also referred to as a "wafer stage" and includes a scanner drive in order to move the substrate synchronously with the mask M perpendicularly to the reference axis in a scanning direction (y-direction).

A mercury vapor lamp is used as the radiation source RS. Here the term "radiation source" is intended to encompass not only the primary radiation source that emits light, but also devices possibly present, such as filters, stops, bandwidth narrowing modules or the like, which serve to alter the spectrum of the primary radiation emitted by the primary radiation source before the radiation enters the illumination system.

FIG. 2 schematically shows a typical emission spectrum of a mercury vapor lamp. The emission spectrum in the range of approximately 350 nm and 450 nm is characterized by the three spectral lines ("mercury lines") having a relatively high intensity I, between which lie spectral ranges having a relatively low intensity. The mercury line i having a centroid wavelength at approximately 365 nm is also referred to as "i-line", the mercury line h having a centroid wavelength at approximately 405 nm is also referred to as "h-line" and the mercury line g at approximately 436 nm is also referred to as "g-line". The mercury vapor lamp thus makes available in this spectral range three discrete centroid wavelengths which are distinctly separated spectrally from one another and the spectral separation $\Delta\lambda$ between which is in each case significantly more than 20 nm, in particular even 30 nm or more.

The projection lens PO is corrected for the three wavelength ranges around the g-line, the h-line and the i-line of mercury. This means, inter alia, that with each of the three wavelengths sufficiently sharp diffraction-limited imaging of the pattern of the mask onto the substrate is possible. In particular, the imaging scale for light of these three lines is identical. However, the best setting planes or focus regions of the three wavelengths do not coincide in an axial direction (i.e. parallel to the axis AX). Rather, the primary longitudinal chromatic aberration and/or the secondary longitudinal chromatic aberration are set such that they do not vanish, but rather have a small finite value, such that the best setting planes for the three centroid wavelengths are axially spaced relative to one another in each case by a finite absolute value, e.g. of the order of magnitude of a Rayleigh unit. This deviation is also referred to as a "focal distance" ($\Delta FOC$).

The projection exposure method that can be carried out with the aid of the projection lens uses this circumstance in a particular way, which will be explained in even greater detail inter alia in association with FIG. 3.

During the preparation of the substrate for the exposure, the substrate is coated with a radiation-sensitive layer in the form of a radiation-sensitive multilayer system MS on its side to be structured or to be subjected to the exposure. The multilayer system MS includes a first photoresist layer FLS1, which consists of the first photoresist material, and a second photoresist layer FLS2, which consists of a second photoresist material, which differs from the first photoresist material chemically and in terms of its photochemical properties. The second photoresist layer FLS2 is arranged between the first photoresist layer FLS1 and the substrate SUB. As a result, the projection radiation emerging from the exit-side end of the projection lens firstly reaches the first photoresist layer FLS1. Afterward, that portion of the radiation which is not absorbed in the first photoresist layer reaches the second photoresist layer FLS2. Differences between the two photoresist layers reside primarily in the dependence of the sensitivity of the photoresist materials on the wavelength.

The first photoresist material is selected such that it has a relatively high sensitivity in a first wavelength range around the centroid wavelength $\lambda_1$, such that the probability of an incident photon from the first wavelength range causing a desired photochemical reaction in the first photoresist layer with relatively high probability is relatively high. In a second wavelength range around the centroid wavelength $\lambda_2$, by contrast, the sensitivity of the first photoresist material is significantly lower relative to the first sensitivity such that photons from the second wavelength range are absorbed in the first photoresist layer FLS1 to a lesser extent than those in the first wavelength range and a larger proportion of the photons from the second wavelength range can thus penetrate to the underlying second photoresist layer FLS2. In the second wavelength range, the second photoresist material, from which the second photoresist layer FLS2 is constructed, has a second sensitivity that is sufficient for the exposure, such that the second wavelength can cause a photochemical reaction to a significant extent within the second photoresist layer FLS2, the reaction altering the properties of the second photoresist material, in particular the solubility thereof.

Such a multilayered construction of a photosensitive layer is producible with high quality using conventional coating technologies. By way of example two layers of different photoresist materials can be applied successively on the substrate via spin-coating.

In the exposure phase of the projection exposure method, the substrate covered with the radiation-sensitive multilayer system MS is exposed with the aid of the projection exposure apparatus. In this case, the radiation source RS is set such that two of the three mercury lines are used simultaneously or synchronously, that is to say for example the i-line in combination with the h-line, the i-line in combination with the g-line, or the h-line in combination with the g-line. One of the two selected lines then corresponds to the first wavelength range, and the second selected line corresponds to the second wavelength range.

In the schematic exemplary case in FIGS. 1 to 3, the projection lens PO is optically corrected such that given a suitable arrangement of the substrate to be exposed in relation to the image plane IS of the projection lens, the best setting plane of the first wavelength, that is to say the first focus region FOC1, lies in the interior of the first photoresist layer FLS1, which is remote from the substrate, while the best setting plane of the second wavelength, that is to say the second focus region FOC2, lies nearer the substrate within the second photoresist layer FLS2.

On account of the different focus positions, therefore, within the first photoresist layer FLS1, the resist image resulting from the exposure is determined primarily by the aerial image of the first wavelength range around $\lambda_1$, while the aerial image of the second wavelength range around $\lambda_2$ determines the resist image nearer the substrate in the second photoresist layer FLS2.

What is achieved by the multilayered construction of the photosensitive layer is that the photosensitive layer is not equally sensitive for all wavelengths at all points, i.e. over the entire depth (in the z-direction), but rather is primarily sensitive to a specific wavelength range or a specific wavelength where the focus region of the corresponding wavelength lies. Under these conditions, such an aerial image having two axially offset focus positions for two discrete wavelengths lying with a spectral separation between one another can lead to an increase in the depth of focus within the relatively thick resist without additional blurring.

Two alternatives relating to the fundamental layer construction of a photosensitive multilayer system MS for use in the context of exemplary embodiments of the disclosure will be explained with reference to FIGS. 4 and 5. FIG. 4 schematically shows a variant in which firstly the second photoresist layer FLS2 is applied to the substrate and then the first photoresist layer is applied directly to the second photoresist layer without the interposition of a further photoresist layer. The two photoresist layers can be applied successively for example via spin-coating.

The first photoresist layer FLS1, which is remote from the substrate and which can also be referred to as "upper" layer, should in this case consist of a photoresist material which absorbs light from the first wavelength range (having a centroid wavelength $\lambda_1$) to a relatively great extent, but predominantly transmits light from the second wavelength range (having a centroid wavelength $\lambda_2$) to the second photoresist layer FLS2. In the case of a photoresist layer, in the context of this application, the two terms "absorb" and "trigger a photochemical reaction" are substantially synonymous in this connection. The second photoresist layer FLS2, which is nearer the substrate and is also referred to as "lower" layer, should consist of a photoresist material which absorbs light in the second wavelength range to a sufficiently great extent, but predominantly transmits light in the first wavelength range.

The desire for greater transmission (that is to say relatively low sensitivity) for the first wavelength range stems from the fact that a larger proportion of the light of the first wavelength should penetrate through the upper photoresist layer (first photoresist layer FLS1) since an excessively great depth dependence of the exposure within the first photoresist layer FLS1 might otherwise result. It has been found to be expedient if, for the first photoresist layer, a first photoresist material is used whose specific absorption or sensitivity is chosen such that between approximately 10% and approximately 30% to 55% of the photons in the first wavelength range are absorbed within the first photoresist layer FLS1, such that a predominant proportion of the first wavelength range is transmitted.

Figure 5:
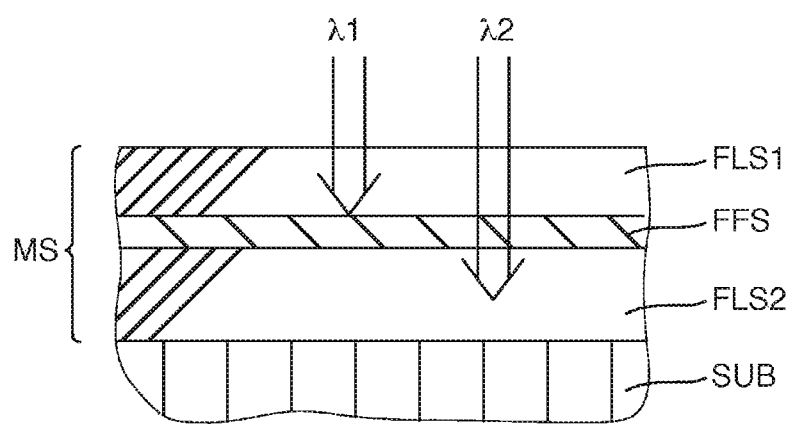
FIG. 5 schematically shows a layer construction of a photosensitive multilayer system having three photoresist layers lying one directly on top of another.

An alternative variant is illustrated schematically in FIG. 5. In this exemplary embodiment, between the first photoresist layer FLS1, which is more remote from the substrate, and the second photoresist layer FLS2, which is nearer the substrate, there is arranged a color filter layer FFS composed of a material selected such that it has a greater transmission in the second wavelength range (which is intended primarily to be used for the exposure of the second photoresist layer FLS2) than in the first wavelength range (which is intended predominantly to be used for the exposure of the first photoresist layer FLS1, more remote from the substrate).

One advantage of this variant is that, on account of the protection by the upstream color filter layer FFS against light in the first wavelength range, the lower layer (second photoresist layer FLS2) nearer the substrate only has to fulfil the property of absorbing light in the second wavelength range to a sufficient extent, that is to say of having a relatively high second sensitivity. The sensitivity to the light in the first wavelength range can then be arbitrary since, on account of the blocking by the color filter layer FFS, a relatively large proportion of the light cannot pass to the second photoresist layer FLS2. In the case of variants having an interposed color filter layer, it is possible, in principle, to produce the first and second photoresist layers from the same photoresist material.

Some concrete exemplary embodiments of "two-wavelength exposures" are indicated below in order to illustrate the principles explained here.

Figure 6A:
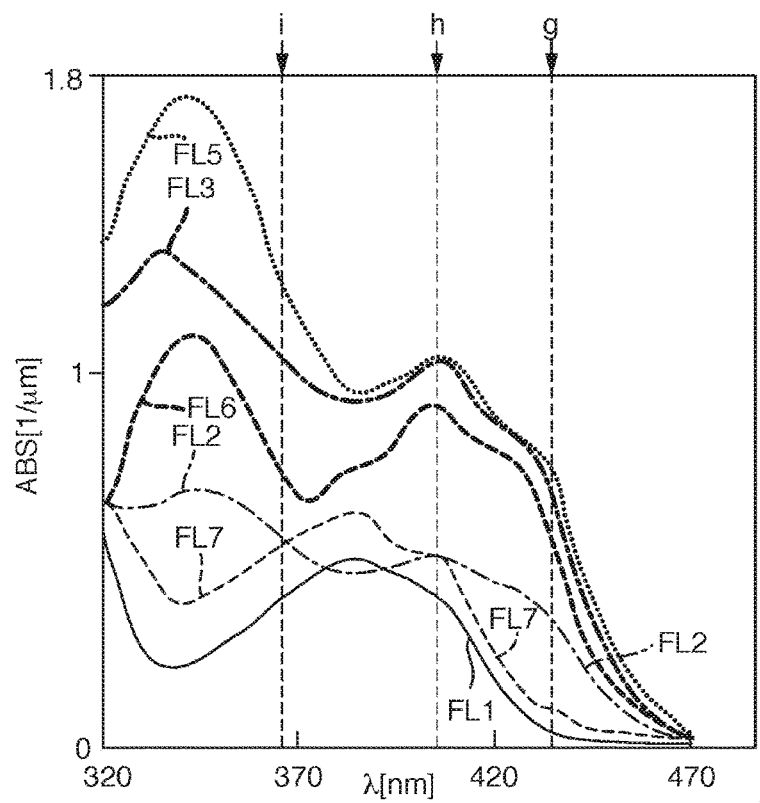
FIG. 6A shows a diagram with absorption curves of some commercially available photoresist materials for use in the context of exemplary embodiments of the disclosure.

The diagram in FIG. 6A schematically shows absorption curves of some commercially available photoresist materials or resist materials. In the diagram, the absorption coefficient ABS (in units of 1/μm) is in each case indicated as a function of the wavelength λ (in [nm]). The curves represent photoresists from MicroChemicals as per the source: http//www-.microchemicals.com/downloads/application_notes.html.
The assignment of the curve designations FL1, FL2, . . . FL7 to the commercial designations AZ® XXX is as follows: FL1=AZ® 9260; FL2=AZ® 4562; FL3®=AZ 6632; FL5=AZ® 1512HS; FL6=AZ® 701MiR and FL7=AZ® 5214E.

Figure 6B:
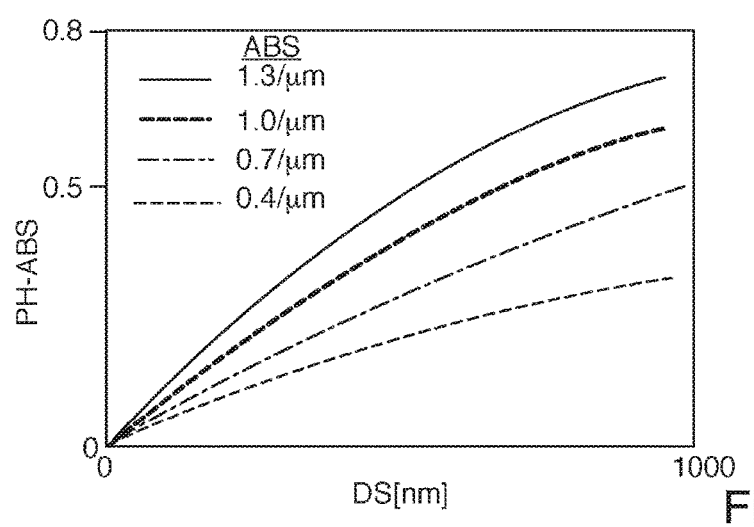
FIG. 6B shows a diagram indicating the dependence of the proportion of absorbed radiation energy on the layer thickness for various absorption coefficients.

The absorption coefficients of the photoresists employed can be used to calculate what proportion of the incident photons of the corresponding wavelength is absorbed depending on the layer thickness. The absorption coefficients are normally specified in the unit 1/μm. Typical values lie in the range of 0.5/μm to 1/μm. This reveals what proportion of the radiation incident on the photoresist layer is absorbed therein. FIG. 6B shows a diagram which indicates the dependence of the proportion PH-ABS of absorbed radiation energy on the layer thickness DS for four different absorption coefficients ABS. The curves illustrated are applicable to an exposure with a low dose or with a low intensity. Photoresists which are not chemically amplified that is to say in particular the photoresists usually used in the region of the g-, h- and i-lines of a mercury lamp, exhibit the phenomenon of bleaching. The absorption of photons by photoresists here has the effect that the photoresist becomes more transparent to further incident photons. For sufficiently intense light doses such as are typically used for the exposure of the photoresist, thus effectively a lower proportion of energy than is illustrated in the drawing is absorbed.

In a first concrete exemplary embodiment, the layer construction in accordance with FIG. 4 is chosen. The second layer (FLS2) near the substrate has a layer thickness of 800 nm and consists of AZ® 4562 (curve FL2). The first layer FLS1 remote from the substrate has a layer thickness of 800 nm and consists of AZ 9260 (FL1). In this exemplary embodiment, the K-line corresponds to the first wavelength range and the g-line corresponds to the second wavelength range. The upper layer (FLS1) reacts practically only to the h-line. The lower layer (FLS2) nearer the substrate reacts to the h-line and the g-line almost to equal degrees. However, since a significant proportion of the h-line radiation has already been absorbed in the upper layer (first photoresist layer FL1), the exposure of the lower layer (second photoresist layer FLS2) is dominated by the g-line radiation. This desired effect is intensified by the fact that a mercury vapor lamp generally emits the g-line with greater intensity than the h-line (cf. FIG. 2).

In a second concrete exemplary embodiment, the layer construction in accordance with FIG. 4 is once again chosen. In this exemplary embodiment, the i-line and the g-line are used for the exposure. The first photoresist layer FLS1 (layer thickness 800 nm) remote from the substrate consists of AZ® 9260 (corresponding to FL1), while the second photoresist layer FLS2 (layer thickness 800 nm) near the substrate consists of AZ® 701MiR (corresponding to FL6). The upper layer (FLS1) remote from the substrate is unchanged vis-à-vis the first concrete example; the lower layer now consists of a material which is intended to react as much as possible only to light of the g-line. This is achievable only to a limited extent because typically the somewhat more energetic photons of the i-line can also trigger reactions which can also be triggered by the photons of the g-line. It is therefore expedient to use a photoresist material which has a local minimum of the sensitivity for the i-line. Since the radiation source typically emits the g-line with somewhat greater intensity than the i-line and a greater proportion of the i-line photons is already absorbed in the first photoresist layer FLS1, what can thus be achieved is that the absorption of photons in the second photoresist layer FLS2 is dominated by photons of the g-line.

In a third concrete exemplary embodiment, the layer construction in accordance with FIG. 4 is once again chosen. In this exemplary embodiment, the i-line and the g-line are used for the exposure. In comparison with the second exemplary embodiment, the upper layer (FLS1) with unchanged layer thickness (800 nm) was replaced by AZ® 1512HS (corresponding to curve FL5), which has a higher absorption for i-light in comparison with AZ® 9260 (corresponding to FL1). The second photoresist layer remains unchanged. What is achieved by the modification is that fewer i-line photons are needed for the exposure, which can be regarded as a desirable effect. However, g-line photons will also contribute to the exposure of the upper layer to a greater extent which may possibly be undesirable.

In a fourth concrete exemplary embodiment, the layer construction in accordance with FIG. 5 is chosen, that is to say having an interposed color filter layer FFS. This exemplary embodiment for the g-line (as second wavelength) and the i-line (as first wavelength) thus uses an additional color-selective intermediate layer. The upper layer (first photoresist layer FLS1) composed of AZ® 5214E (corresponding to FL7) has a layer thickness of 800 nm and is practically not sensitive to g-line light, such that practically only i-line light contributes to the exposure. The lower layer (second photoresist layer FLS2) composed of AZ® 6632 (corresponding to FL3) has a layer thickness of 800 nm and is chosen primarily on account of its g-line sensitivity, that is to say that its behavior for i-line radiation is irrelevant. Between these two resists, a 90 nm thick color filter layer FFS is used as an intermediate layer and filters out or blocks the i-line, such that i-line light practically cannot penetrate to the second photoresist layer FLS2.

By way of example, a bottom antireflective coating (BARC) for i-line can be used as a color filter layer. A BARC is intended to prevent the back-reflection of the corresponding light and is therefore strongly absorbent for the corresponding wavelength (here: i-line). A further mechanism of action of a BARC resides in interference as a result of multiple reflection of the radiation within the BARC. Given a specific layer thickness of the color filter layer FFS, the back-reflection of the i-line radiation into the upper layer (FLS1) is suppressed. Back-reflected light, as a result of superimposition with the incident light in the resist, can generate undesired superimpositions known as swing curves. The latter can occur particularly in the case of thick resist layers. In the case of AZ® BARLi II 90, the thickness for which this suppression of back-reflection takes place is 90 nm.

If the thickness of a BARC is increased by 50% (to 135 nm in the example), then a maximum, rather than a minimum, back-reflection of i-line radiation occurs. This has the disadvantage that swing curves can become more intense (which has only weak effects under certain circumstances in the case of a thinner layer), but in return affords the advantage of improved blocking, such that less i-line radiation can penetrate through the color filter layer in an undesirable manner.

Various types of projection lenses can be used for carrying out the method. By way of example, it is possible to use a dioptric projection lens, that is to say a projection lens in which all optical elements exhibiting refractive power (in particular lens elements) consist of a material that is transparent in the operating wavelength range. It is also possible for the projection lens to be a catadioptric projection lens, that is to say a projection lens in which, in addition to transparent optical elements (e.g. lens elements), at least one curved mirror, in particular a concave mirror, is provided in the projection beam path.

Suitable catadioptric projection lenses can be developed e.g. from the examples shown in U.S. Pat. No. 7,760,452 B2 by modifications for altering the primary and/or secondary longitudinal chromatic aberration. Reducing lenses are preferably used, that is to say those projection lenses which image the pattern onto the image plane or the substrate on a reducing scale (e.g. 1:4 or 1:5). Image-side numerical apertures in NA in the range of NA=0.5 or NA=0.6 to NA=0.8 or NA=0.93 often provide a good compromise between achievable resolution and production outlay for the projection exposure apparatus, since the number and size of the optical elements in the projection optical unit increase significantly with the numerical aperture.

Figure 7:
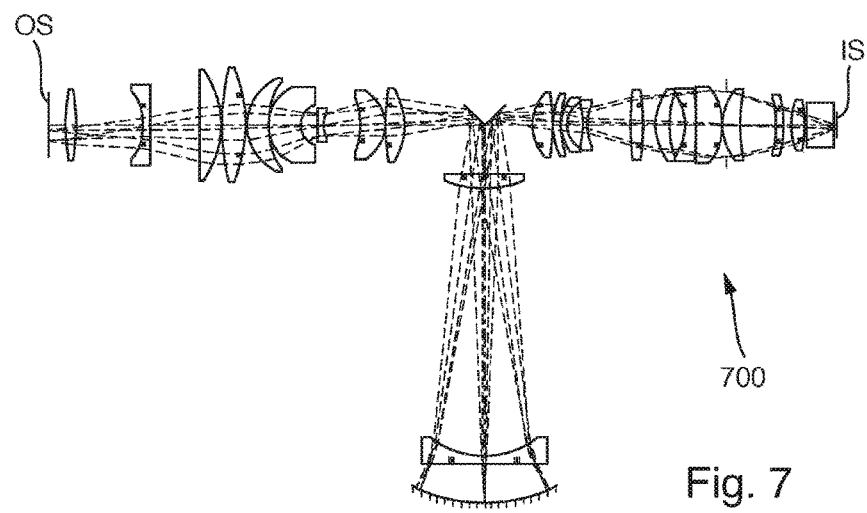
FIG. 7 shows a projection lens in accordance with a first exemplary embodiment.
Figure 8:
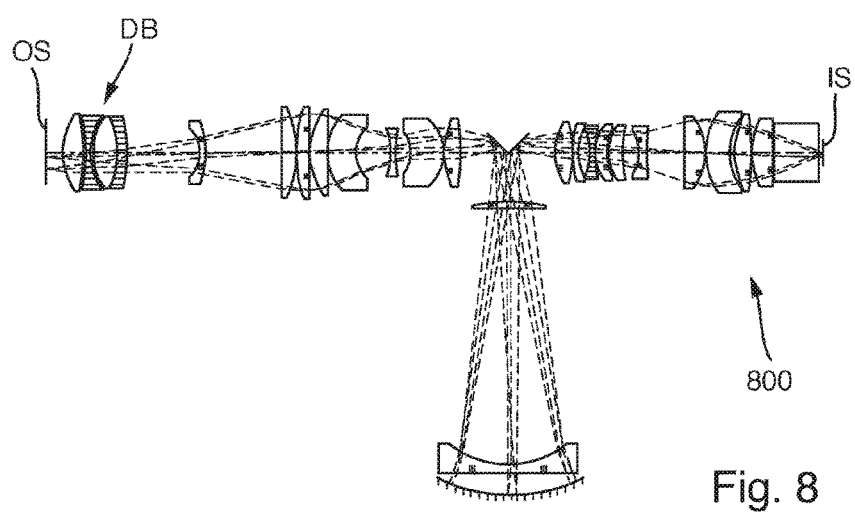
FIG. 8 shows a projection lens in accordance with a second exemplary embodiment.

FIG. 7 and FIG. 8 show exemplary embodiments exhibiting extreme broadband correction. U.S. Pat. No. 7,760,452 B2 gives information about the general correction principles of the designs. The designs have been developed from the embodiment in FIG. 3a from U.S. Pat. No. 7,760,452 B2. The designs are corrected for the wavelength ranges around the g- (436nm), h- (405nm) and i-lines (365nm) of mercury. In this respect, the disclosure of the patent U.S. Pat. No. 7,760,452 B2 is incorporated by reference in the content of the present description.

The sole modification vis-à-vis U.S. Pat. No. 7,760,452 B2 is that the primary and/or secondary longitudinal chromatic aberration do not vanish, but rather have a small value, such that the best setting planes for the three centroid wavelengths are axially displaced relative to one another by a finite absolute value (e.g. of the order of magnitude of a Rayleigh unit RU). Since both primary and secondary longitudinal chromatic aberration is correctable in the designs (otherwise the spectral broadband characteristic would not be ensured), the sequence of the focal planes is a priori freely selectable.

In the examples in FIGS. 7 and 8 (or respectively tables 7, 7A, 8, 8A), the setting plane of the i-line lies approximately 1.5 μm behind and that of the g-line 1.5 μm in front of the central h-line (i.e. the focal distance is approximately 1.5 μm in each case). This can be achieved by slight detuning of the primary longitudinal chromatic aberration. The detuning is so marginal that structural measures which differentiate the present design from the prior art from U.S. Pat. No. 7,760,452 B2 are scarcely discernible.

The exemplary embodiment of the projection lens 700 in FIG. 7 is very similar to the design from FIG. 3a in U.S. Pat. No. 7,760,452 B2, with the difference of the slight detuning of the primary longitudinal chromatic aberration. In the design from FIG. 7, the stop plane in the system part near the reticle defines the pupil position in the system. The stop plane is imaged into the reticle area by the entire front system part. However, this imaging is chromatically undercorrected to a significant extent, with the consequence that the position of the entrance pupil varies with the wavelength and the system thus exhibits different telecentricity behavior at the reticle for different wavelengths.

A chromatic correction of the pupil imaging can be achieved by chromatically correcting lens parts near the hatch, i.e. in particular the lens parts near the reticle and the intermediate images. In the example of the projection lens 800 in FIG. 8, the chromatic correction of the pupil imaging was able to be achieved by the use of an achromatic, overcorrecting doublet DB directly downstream of the reticle plane.

The specifications of the projection lenses shown in the figures of the drawing are indicated in the tables compiled at the end of the description, the numbering of which tables respectively corresponds to the numbering of the corresponding figure of the drawing.

The tables summarize the specification of the respective design in tabular form. In this case, column "SURF" indicates the number of a refractive surface or surface distinguished in some other way, column "RADIUS" indicates the radius r of the surface (in mm), column "THICKNESS" indicates the distance d—designated as thickness—between the surface and the subsequent surface (in mm) and column "MATERIAL" indicates the material of the optical components. Columns "INDEX1", "INDEX2" and "INDEX3" indicate the refractive index of the material at the design operating wavelength 405.0 nm (INDEX1) and at 365.5 nm (INDEX2) and 436.0 nm (INDEX3). Column "SEMIDIAM" indicates the usable, free radii or the free optical semidiameters of the lens elements (in mm) or of the optical elements. The radius r=0 (in the column "RADIUS") corresponds to a plane. Some optical surfaces are aspherical. Tables with appended "A" indicate the corresponding asphere data, wherein the aspherical surfaces are calculated according to the following specification:

$$p(h)=[((1/r)h^2)/(1+\text{SQRT}(1-(1+K)(1/r)^2h^2))]+C1*h^4+C2*h^6+\ldots$$

In this case, the reciprocal (1/r) of the radius indicates the surface curvature and h indicates the distance between a surface point and the optical axis (i.e. the beam height). Consequently, p(h) indicates the sagittal height, i.e. the distance between the surface point and the surface vertex in the z-direction (direction of the optical axis). The constants K, C1, C2, . . . are represented in the tables with appended "A". If the conic constant K is equal to 0, then the formula above can be simplified to:

$$p(h)=r-\text{SQRT}(r^2-h^2)+C1*h^4+C2*h^6+\ldots$$

The projection lenses of the exemplary embodiments are designed for an image-side numerical aperture NA=0.5. The object height is 62 mm in each case.

TABLE 7

| SURF | RADIUS | THICKNESS | MATERIAL | INDEX1 | INDEX2 | INDEX3 | SEMIDIAM. |
|---|---|---|---|---|---|---|---|
| 0 | 0.000000 | 30.999239 | | | | | 62.0 |
| 1 | 373.037363 | 20.185220 | SILUV | 1.469595 | 1.474477 | 1.466705 | 67.0 |
| 2 | −541.760232 | 129.422263 | | | | | 67.3 |
| 3 | −115.028462 | 9.999705 | SILUV | 1.469595 | 1.474477 | 1.466705 | 65.7 |
| 4 | 782.096792 | 97.474648 | | | | | 72.3 |
| 5 | 5509.601771 | 40.383963 | SILUV | 1.469595 | 1.474477 | 1.466705 | 105.7 |
| 6 | −203.776252 | 0.998640 | | | | | 107.6 |
| 7 | 529.048728 | 46.003379 | SILUV | 1.469595 | 1.474477 | 1.466705 | 109.7 |
| 8 | −237.562584 | 0.998896 | | | | | 109.2 |
| 9 | 103.370551 | 41.199723 | SILUV | 1.469595 | 1.474477 | 1.466705 | 90.2 |
| 10 | 186.249835 | 0.999230 | | | | | 84.9 |
| 11 | 88.404710 | 59.547566 | SILUV | 1.469595 | 1.474477 | 1.466705 | 72.8 |
| 12 | 46.514366 | 34.120437 | | | | | 37.9 |
| 13 | −654.141211 | 9.999203 | LLF1 | 1.569035 | 1.579164 | 1.563301 | 28.7 |
| 14 | 69.841318 | 70.409654 | | | | | 23.6 |
| 15 | −130.842157 | 45.398433 | SILUV | 1.469595 | 1.474477 | 1.466705 | 53.2 |
| 16 | −77.580480 | 0.999277 | | | | | 63.7 |
| 17 | 262.716015 | 35.541566 | SILUV | 1.469595 | 1.474477 | 1.466705 | 69.8 |
| 18 | −155.985117 | 154.304081 | | | | | 70.6 |
| 19 | 0.000000 | −98.001733 | REFL | | | | 58.2 |
| 20 | 953.262426 | −30.000163 | SILUV | 1.469595 | 1.474477 | 1.466705 | 70.1 |
| 21 | 184.528258 | −539.193237 | | | | | 72.9 |
| 22 | 156.598936 | −15.000000 | SILUV | 1.469595 | 1.474477 | 1.466705 | 100.3 |
| 23 | −4650.355141 | −79.514276 | | | | | 114.9 |
| 24 | 309.705734 | 79.514276 | REFL | | | | 135.5 |
| 25 | −4650.355141 | 15.000000 | SILUV | 1.469595 | 1.474477 | 1.466705 | 114.9 |
| 26 | 156.598936 | 539.193237 | | | | | 100.3 |
| 27 | 184.528258 | 30.000163 | SILUV | 1.469595 | 1.474477 | 1.466705 | 72.9 |
| 28 | 953.262426 | 98.001733 | | | | | 70.1 |
| 29 | 0.000000 | −90.998413 | REFL | | | | 56.0 |
| 30 | −92.968839 | −38.386976 | SILUV | 1.469595 | 1.474477 | 1.466705 | 65.0 |
| 31 | 420.362199 | −0.998431 | | | | | 61.5 |
| 32 | −150.858410 | −13.920740 | SILUV | 1.469595 | 1.474477 | 1.466705 | 55.4 |
| 33 | −215.655266 | −0.998336 | | | | | 52.6 |
| 34 | −84.111220 | −9.998184 | SILUV | 1.469595 | 1.474477 | 1.466705 | 49.4 |
| 35 | −55.013593 | −30.578858 | | | | | 43.1 |
| 36 | 147.410830 | −9.999697 | LLF1 | 1.569035 | 1.579164 | 1.563301 | 42.7 |
| 37 | −151.310806 | −81.051032 | | | | | 43.5 |
| 38 | −466.983054 | −23.006065 | SILUV | 1.469595 | 1.474477 | 1.466705 | 62.1 |
| 39 | 1467.053388 | −23.999990 | | | | | 63.8 |
| 40 | −118.647192 | −27.288965 | SILUV | 1.469595 | 1.474477 | 1.466705 | 66.8 |
| 41 | −252.483473 | −28.266766 | | | | | 64.3 |
| 42 | 194.359802 | −19.929542 | SILUV | 1.469595 | 1.474477 | 1.466705 | 63.8 |
| 43 | 974.991650 | −1.024234 | | | | | 67.8 |
| 44 | −3810.639438 | −49.866014 | SILUV | 1.469595 | 1.474477 | 1.466705 | 68.3 |
| 45 | 112.221510 | −0.998878 | | | | | 70.8 |
| 46 | −107.009990 | −33.102042 | SILUV | 1.469595 | 1.474477 | 1.466705 | 72.1 |
| 47 | −379.868857 | 23.900689 | | | | | 70.0 |
| 48 | 0.000000 | −94.616886 | | | | | 70.8 |
| 49 | 199.265941 | −12.660793 | SILUV | 1.469595 | 1.474477 | 1.466705 | 60.1 |
| 50 | 102.694472 | −16.977099 | | | | | 59.9 |
| 51 | −146.212382 | −24.054677 | SILUV | 1.469595 | 1.474477 | 1.466705 | 57.2 |
| 52 | 2651.110005 | −2.997905 | | | | | 56.3 |
| 53 | −376.636246 | −53.957363 | SILUV | 1.469595 | 1.474477 | 1.466705 | 49.3 |
| 54 | 0.000000 | −6.000000 | | | | | 30.3 |
| 55 | 0.000000 | 0.000000 | | | | | 15.5 |

TABLE 7A

| SRF | 3 | 8 | 15 | 17 | 20 |
|---|---|---|---|---|---|
| K | 0 | 0 | 0 | 0 | 0 |
| C1 | −2.887581E−09 | 2.754947E−08 | 3.143831E−07 | −1.809897E−07 | 1.822000E−08 |
| C2 | 3.639247E−12 | −1.317980E−14 | −7.166394E−11 | 1.503296E−11 | 8.194813E−13 |
| C3 | 2.299133E−16 | −4.450129E−19 | 1.771371E−14 | −2.059691E−15 | −1.148136E−16 |
| C4 | −5.519562E−20 | 2.195748E−22 | −3.823760E−18 | 2.658837E−19 | 2.081649E−20 |
| C5 | 1.539807E−23 | −9.937547E−27 | 5.827682E−22 | −2.414969E−23 | −1.612146E−24 |
| C6 | −1.297884E−27 | 5.245909E−32 | −4.128253E−26 | 9.808433E−28 | 3.106512E−29 |

| SRF | 23 | 25 | 28 | 30 | 39 |
|---|---|---|---|---|---|
| K | 0 | 0 | 0 | 0 | 0 |
| C1 | 1.567459E−08 | 1.567459E−08 | 1.822000E−08 | 9.365817E−08 | 1.098453E−07 |
| C2 | −3.503920E−13 | −3.503920E−13 | 8.194813E−13 | 8.740047E−12 | 8.465549E−12 |
| C3 | 8.470661E−18 | 8.470661E−18 | −1.148136E−16 | 9.918516E−16 | 3.642033E−16 |
| C4 | 9.577812E−23 | 9.577812E−23 | 2.081649E−20 | −3.869321E−20 | 7.611225E−20 |
| C5 | −1.749301E−26 | −1.749301E−26 | −1.612146E−24 | 2.251688E−23 | −2.433024E−23 |
| C6 | 4.530886E−31 | 4.530886E−31 | 3.106512E−29 | −5.451527E−28 | 2.063618E−27 |

| SRF | 42 | 45 | 50 | 52 |
|---|---|---|---|---|
| K | 0 | 0 | 0 | 0 |
| C1 | 3.195231E−07 | −4.771259E−08 | −6.368113E−07 | 1.386434E−06 |
| C2 | 6.720416E−12 | −5.962148E−12 | 5.631346E−11 | −3.592014E−10 |
| C3 | −1.618440E−15 | −6.642272E−16 | −2.607509E−14 | 7.319747E−14 |
| C4 | 5.783600E−20 | −1.571383E−20 | 5.566104E−18 | −1.403844E−17 |
| C5 | −9.870658E−23 | −5.245497E−24 | −1.067046E−21 | 3.109777E−21 |
| C6 | 1.248526E−26 | 7.806076E−28 | 8.389797E−26 | −4.692062E−25 |

TABLE 8

| SURF | RADIUS | THICKNESS | MATERIAL | INDEX1 | INDEX2 | INDEX3 | SEMIDIAM. |
|---|---|---|---|---|---|---|---|
| 0 | 0.000000 | 30.994669 | | | | | 62.0 |
| 1 | 125.641356 | 36.993327 | SILUV | 1.469595 | 1.474477 | 1.466705 | 68.6 |
| 2 | −346.945721 | 6.623566 | | | | | 67.4 |
| 3 | −242.098198 | 9.998993 | LLF1 | 1.569035 | 1.579164 | 1.563301 | 66.2 |
| 4 | 109.729798 | 4.680913 | | | | | 63.6 |
| 5 | 117.631569 | 45.328857 | SILUV | 1.469595 | 1.474477 | 1.466705 | 65.1 |
| 6 | −142.684885 | 1.009339 | | | | | 65.1 |
| 7 | −167.247330 | 16.800175 | LLF1 | 1.569035 | 1.579164 | 1.563301 | 64.0 |
| 8 | −371.219100 | 144.028763 | | | | | 63.8 |
| 9 | −66.701122 | 9.999415 | SILUV | 1.469595 | 1.474477 | 1.466705 | 48.7 |
| 10 | −163.310914 | 150.611114 | | | | | 53.6 |
| 11 | −2850.141731 | 22.731693 | SILUV | 1.469595 | 1.474477 | 1.466705 | 80.9 |
| 12 | −237.351495 | 0.999433 | | | | | 82.1 |
| 13 | 262.189826 | 27.438280 | SILUV | 1.469595 | 1.474477 | 1.466705 | 82.5 |
| 14 | −1262.513805 | 0.999073 | | | | | 81.3 |
| 15 | 137.001521 | 31.478056 | SILUV | 1.469595 | 1.474477 | 1.466705 | 77.2 |
| 16 | 2947.559047 | 0.999505 | | | | | 74.5 |
| 17 | 101.266428 | 52.532392 | SILUV | 1.469595 | 1.474477 | 1.466705 | 67.4 |
| 18 | 66.613615 | 67.050232 | | | | | 47.7 |
| 19 | −148.997684 | 9.998622 | LLF1 | 1.569035 | 1.579164 | 1.563301 | 39.8 |
| 20 | 171.702830 | 30.186653 | | | | | 39.5 |
| 21 | −58.042538 | 64.531134 | SILUV | 1.469595 | 1.474477 | 1.466705 | 40.6 |
| 22 | −81.864968 | 0.997141 | | | | | 58.9 |
| 23 | 110.035450 | 32.146941 | SILUV | 1.469595 | 1.474477 | 1.466705 | 61.2 |
| 24 | −379.761919 | 92.777554 | | | | | 59.9 |
| 25 | 0.000000 | −98.001733 | REFL | | | | 44.0 |
| 26 | −368.077865 | −16.386146 | SILUV | 1.469595 | 1.474477 | 1.466705 | 65.1 |
| 27 | 735.840504 | −499.853075 | | | | | 65.9 |
| 28 | 166.867022 | −15.000000 | SILUV | 1.469595 | 1.474477 | 1.466705 | 115.4 |
| 29 | −1827.676972 | −43.702658 | | | | | 137.4 |
| 30 | 267.329987 | 43.702658 | REFL | | | | 139.4 |
| 31 | −1827.676972 | 15.000000 | SILUV | 1.469595 | 1.474477 | 1.466705 | 137.4 |
| 32 | 166.867022 | 499.853075 | | | | | 115.4 |
| 33 | 735.840504 | 16.386146 | SILUV | 1.469595 | 1.474477 | 1.466705 | 65.9 |
| 34 | −368.077865 | 98.001733 | | | | | 65.1 |
| 35 | 0.000000 | −90.999365 | REFL | | | | 43.8 |
| 36 | −102.248394 | −33.274995 | SILUV | 1.469595 | 1.474477 | 1.466705 | 52.4 |
| 37 | 281.691798 | −0.998017 | | | | | 51.1 |
| 38 | −189.941635 | −9.999060 | SILUV | 1.469595 | 1.474477 | 1.466705 | 48.3 |
| 39 | −104.251757 | −22.250631 | | | | | 44.9 |
| 40 | 117.698060 | −9.998375 | LLF1 | 1.569035 | 1.579164 | 1.563301 | 44.4 |
| 41 | −240.955384 | −0.994228 | | | | | 45.8 |

TABLE 8-continued

| SURF | RADIUS | THICKNESS | MATERIAL | INDEX1 | INDEX2 | INDEX3 | SEMIDIAM. |
|---|---|---|---|---|---|---|---|
| 42 | −76.766716 | −21.285981 | SILUV | 1.469595 | 1.474477 | 1.466705 | 48.7 |
| 43 | −135.907039 | −3.499905 | | | | | 46.8 |
| 44 | −74.898007 | −27.735790 | SILUV | 1.469595 | 1.474477 | 1.466705 | 47.4 |
| 45 | −264.831457 | −29.416214 | | | | | 44.3 |
| 46 | 116.358117 | −14.999625 | SILUV | 1.469595 | 1.474477 | 1.466705 | 40.7 |
| 47 | −254.633674 | −75.160401 | | | | | 42.8 |
| 48 | −895.744632 | −40.753240 | SILUV | 1.469595 | 1.474477 | 1.466705 | 64.0 |
| 49 | 102.686711 | −0.999128 | | | | | 68.2 |
| 50 | −128.022889 | −47.652176 | SILUV | 1.469595 | 1.474477 | 1.466705 | 73.2 |
| 51 | −121.088770 | 74.579730 | | | | | 66.5 |
| 52 | 0.000000 | −82.341970 | | | | | 58.7 |
| 53 | −146.606909 | −33.307943 | SILUV | 1.469595 | 1.474477 | 1.466705 | 66.9 |
| 54 | 182.689561 | −0.998718 | | | | | 65.8 |
| 55 | −125.099703 | −39.073806 | SILUV | 1.469595 | 1.474477 | 1.466705 | 60.8 |
| 56 | −239.782755 | −2.132900 | | | | | 52.9 |
| 57 | −339.123355 | −90.180480 | SILUV | 1.469595 | 1.474477 | 1.466705 | 51.0 |
| 58 | 0.000000 | −6.000000 | | | | | 19.1 |
| 59 | 0.000000 | 0.000000 | | | | | 15.5 |

TABLE 8A

| SRF | 9 | 14 | 21 | 23 | 26 |
|---|---|---|---|---|---|
| K | 0 | 0 | 0 | 0 | 0 |
| C1 | −1.281898E−08 | 1.679216E−08 | 6.826803E−07 | −2.805214E−07 | 3.480613E−08 |
| C2 | 1.919413E−11 | 4.261661E−13 | −1.860015E−10 | 2.209415E−11 | 8.117968E−13 |
| C3 | 3.145778E−15 | 4.839749E−18 | 5.575586E−14 | −4.288884E−15 | −3.187963E−16 |
| C4 | 1.261029E−18 | −2.479651E−21 | −2.676663E−17 | 6.340941E−19 | 6.252202E−20 |
| C5 | −1.352670E−22 | 3.536604E−25 | 8.461123E−21 | −7.584238E−23 | −7.098223E−24 |
| C6 | 1.228604E−25 | −1.718615E−29 | −2.541758E−24 | 4.568623E−27 | 3.972776E−28 |

| SRF | 29 | 31 | 34 | 36 | 43 |
|---|---|---|---|---|---|
| K | 0 | 0 | 0 | 0 | 0 |
| C1 | 1.770146E−08 | 1.770146E−08 | 3.480613E−08 | −8.917220E−08 | −6.391990E−07 |
| C2 | −4.023066E−13 | −4.023066E−13 | 8.117968E−13 | 5.242418E−12 | 1.571295E−12 |
| C3 | 1.150398E−17 | 1.150398E−17 | −3.187963E−16 | 4.491605E−16 | 1.236663E−14 |
| C4 | −3.317847E−22 | −3.317847E−22 | 6.252202E−20 | 2.858433E−19 | 1.908698E−18 |
| C5 | 7.488276E−27 | 7.488276E−27 | −7.098223E−24 | −9.489181E−23 | 5.567362E−22 |
| C6 | −8.623680E−32 | −8.623680E−32 | 3.972776E−28 | 1.751423E−26 | 1.532807E−25 |

| SRF | 46 | 49 | 54 | 56 |
|---|---|---|---|---|
| K | 0 | 0 | 0 | 0 |
| C1 | 5.488053E−07 | −9.297460E−08 | −3.351087E−07 | 8.076670E−07 |
| C2 | 1.327211E−10 | 3.041983E−13 | 2.424051E−11 | −1.286212E−10 |
| C3 | 3.542785E−14 | −3.996630E−16 | −4.207967E−15 | 2.319293E−15 |
| C4 | −5.251783E−18 | −5.695200E−20 | 7.703106E−19 | 3.014464E−18 |
| C5 | 9.721746E−21 | 4.861379E−24 | −8.915061E−23 | −6.281739E−22 |
| C6 | −2.187672E−24 | −7.767578E−28 | 5.063466E−27 | 4.132915E−26 |

What is claimed is:

1. A projection exposure apparatus configured to expose a substrate arranged in a region of an image plane of a projection lens with at least one image of a pattern of a mask arranged in a region of an object plane of the projection lens, the projection exposure apparatus comprising:
 a primary radiation source configured to emit radiation in an operating wavelength range comprising a first wavelength range and a second wavelength range separate from the first wavelength range;
 an illumination system configured to receive the radiation and to generate an illumination radiation directed onto the mask;
 a projection lens configured to generate an image of the pattern in the region of the image surface of the projection lens, wherein:
 the projection exposure apparatus is configured so that the projection lens is corrected at least for the first wavelength range and the second wavelength range so that with each wavelength in the first and second wavelength ranges a sharp diffraction-limited imaging of the pattern onto the substrate is possible with an identical imaging scale; and
 a first focus region associated with the first wavelength range is offset relative to a second focus region associated with the second wavelength range by a focal distance.

2. The projection exposure apparatus of claim 1, wherein:
the projection lens is configured so that the focal distance is in a range of $RU_M$ to $RU_M/4$;
$RU_M = \lambda_M/NA^2$; and
$\lambda_M$ is an operating wavelength averaged from the first and second wavelength ranges and NA is the image-side numerical aperture of the projection lens.

3. The projection exposure apparatus of claim 1, wherein:
the radiation source comprises a mercury vapor lamp;
the first wavelength range comprises exactly one of the mercury lines having a centroid wavelength at approximately 365 nm (i-line), approximately 405 nm (h-line), and approximately 436 nm (g-line); and
the second wavelength range comprises exactly one different mercury line from among the mercury lines.

4. A projection exposure apparatus configured to expose a substrate arranged in a region of an image plane of a projection lens with at least one image of a pattern of a mask arranged in a region of an object plane of the projection lens, the projection exposure apparatus comprising:
a primary radiation source configured to emit radiation in an operating wavelength range comprising a first wavelength range and a second wavelength range separate from the first wavelength range;
an illumination system configured to receive the radiation and to generate an illumination radiation directed onto the mask;
a projection lens configured to generate an image of the pattern in the region of the image surface of the projection lens,
wherein:
the projection exposure apparatus is configured so that the projection lens is corrected at least for the first wavelength range and the second wavelength range so that with each wavelength in the first and second wavelength ranges a sharp diffraction-limited imaging of the pattern onto the substrate is possible with an identical imaging scale;
a first focus region associated with the first wavelength range is offset relative to a second focus region associated with the second wavelength range by a focal distance;
the substrate supports first and second photoresist layers;
the first photoresist layer comprises a first photoresist material;
the second photoresist layer comprises a second photoresist material;
the second photoresist layer is between the first photoresist layer and the substrate;
the first photoresist material has a first sensitivity in the first wavelength range;
the first photoresist has a second sensitivity in the second wavelength range;
the second sensitivity is less than the first sensitivity; and
the second photoresist material has an exposure-suitable second sensitivity in the second wavelength range.

5. The projection exposure apparatus of claim 4, wherein the first photoresist material and the second photoresist material have different spectral sensitivity characteristics.

6. The projection exposure apparatus of claim 4, wherein:
the first photoresist material is such that between 10% and 60% of the photons in the first wavelength range are absorbed within the first photoresist layer; and
the second photoresist material is such that between 10% and 60% of the photons in the second wavelength range are absorbed within the second photoresist layer.

7. The projection exposure apparatus of claim 4, wherein the first photoresist material is such that between 10% and 60% of the photons in the first wavelength range are absorbed within the first photoresist layer.

8. The projection exposure apparatus of claim 4, wherein the first photoresist material is such that a number of the photons in the first wavelength range that are absorbed in the first photoresist layer is at least 50% greater than a number of the photons in the second wavelength range that are absorbed in the first photoresist layer; and the second photoresist material is such that a number of the photons in the second wavelength range that are absorbed in the second photoresist layer is at least 50% greater than a number of the photons in the first wavelength range that are absorbed in the second photoresist layer.

9. The projection exposure apparatus of claim 4, wherein the first photoresist material is such that a number of the photons in the first wavelength range that are absorbed in the first photoresist layer is at least 50% greater than a number of the photons in the second wavelength range that are absorbed in the first photoresist layer.

10. The projection exposure apparatus of claim 4, wherein the first photoresist material is such that fewer than 30% of photons in the second wavelength range are absorbed within the first photoresist layer.

11. The projection exposure apparatus of claim 4, wherein the substrate further comprises a color filter layer between the first and second photoresist layers, and the color filter layer comprises a material having a greater transmission in the second wavelength range than in the first wavelength range.

12. The projection exposure apparatus of claim 4, wherein:
a layer thickness of the first photoresist layer lies in the range of $RU_1$ bis $RU_1/4$, $RU_1=\lambda_1/NA^2$, $\lambda_1$ is a centroid wavelength of the first wavelength range, and NA is an image-side numerical aperture of the projection lens;
a layer thickness of the second photoresist layer lies in the range of $RU_2$ to $RU_2/4$, $RU_2=\lambda_2/NA^2$, $\lambda_2$ is a centroid wavelength of the second wavelength range, and NA is an image-side numerical aperture of the projection lens.

13. The projection exposure apparatus of claim 4, wherein a layer thickness of the first photoresist layer lies in the range of $RU_1$ bis $RU_1/4$, $RU_1=\lambda_1/NA^2$, $\lambda_1$ is a centroid wavelength of the first wavelength range, and NA is an image-side numerical aperture of the projection lens.

14. The projection exposure apparatus of claim 4, wherein at least one of the following holds:
a layer thickness of the first photoresist layer is in a range of 50 nm to 1500 nm; and
a layer thickness of the second photoresist layer in a range of 50 nm to 1500 nm.

15. The projection exposure apparatus of claim 4, wherein:
a layer thickness of the first photoresist layer is in a range of 50 nm to 1500 nm; and
a layer thickness of the second photoresist layer in a range of 50 nm to 1500 nm.

16. The projection exposure apparatus of claim 4, wherein a spectral separation $\Delta\lambda$, between a centroid wavelength of the first wavelength range and a centroid wavelength of the second wavelength range is at least 10 nm.

17. The projection exposure apparatus of claim 4, wherein the second photoresist material is such that between 10% and 60% of the photons in the second wavelength range are absorbed within the second photoresist layer.

18. The projection exposure apparatus of claim 4, wherein the second photoresist material is such that a number of the photons in the second wavelength range that are absorbed in the second photoresist layer is at least 50% greater than a number of the photons in the first wavelength range that are absorbed in the second photoresist layer.

19. The projection exposure apparatus of claim 4, wherein a layer thickness of the second photoresist layer lies in the range of $RU_2$ to $RU_2/4$, $RU_2=\lambda_2/NA^2$, $\lambda_2$ is a centroid wavelength of the second wavelength range, and NA is an image-side numerical aperture of the projection lens.

* * * * *

UNITED STATES PATENT AND TRADEMARK OFFICE
CERTIFICATE OF CORRECTION

PATENT NO. : 10,514,611 B2
APPLICATION NO. : 16/296662
DATED : December 24, 2019
INVENTOR(S) : Michael Patra Page 1 of 1

It is certified that error appears in the above-identified patent and that said Letters Patent is hereby corrected as shown below:

In the Specification

Column 14, Line 13, delete "K-line" and insert -- h-line --;

In the Claims

Column 24, Line 34, Claim 12, after "lens;" insert -- and --;

Column 24, Line 57, Claim 16, delete "$\Delta\lambda$," and insert -- $\Delta\lambda$ --.

Signed and Sealed this
Seventh Day of April, 2020

Andrei Iancu
*Director of the United States Patent and Trademark Office*